(12) United States Patent
McGarvey et al.

(10) Patent No.: US 10,834,345 B1
(45) Date of Patent: Nov. 10, 2020

(54) TEMPERATURE AND NON-UNIFORMITY COMPENSATION CIRCUITRY FOR SILICON PHOTOMULTIPLIER

(71) Applicant: SEMICONDUCTOR COMPONENTS INDUSTRIES, LLC, Phoenix, AZ (US)

(72) Inventors: Brian Patrick McGarvey, Templemartin (IE); Stephen John Bellis, Cobh (IE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/447,084

(22) Filed: Jun. 20, 2019

(51) Int. Cl.
| | |
|---|---|
| H04N 5/361 | (2011.01) |
| H01L 27/146 | (2006.01) |
| H04N 5/369 | (2011.01) |
| H01L 31/107 | (2006.01) |

(52) U.S. Cl.
CPC ....... *H04N 5/361* (2013.01); *H01L 27/14627* (2013.01); *H01L 27/14643* (2013.01); *H01L 31/107* (2013.01); *H04N 5/3698* (2013.01)

(58) Field of Classification Search
CPC .... H04N 5/361; H04N 5/3698; H01L 31/107; H01L 27/14643; H01L 27/14627
USPC ........ 348/294–324; 250/208.1; 257/290–292
See application file for complete search history.

(56) References Cited

U.S. PATENT DOCUMENTS

| | | |
|---|---|---|
| 8,395,127 B1 | 3/2013 | Frach |
| 8,399,848 B2 | 3/2013 | Frach |
| 8,426,827 B2 | 4/2013 | Cahill |
| 8,476,594 B2 | 7/2013 | Frach |
| 2011/0222051 A1* | 9/2011 | Heng ................ G01N 15/147 356/73 |
| 2011/0291017 A1 | 12/2011 | Frach |
| 2017/0031009 A1* | 2/2017 | Davidovic ............ G01S 7/4865 |
| 2017/0322324 A1* | 11/2017 | Fu .......................... G01T 1/247 |

OTHER PUBLICATIONS

Brian McGarvey et al. "Semiconductor Photomultiplier," U.S. Appl. No. 14/577,123, filed Dec. 19, 2014; abandoned.

* cited by examiner

*Primary Examiner* — Yogesh K Aggarwal
(74) *Attorney, Agent, or Firm* — Treyz Law Group, P.C.; Jason Tsai (57) ABSTRACT

An imaging device may include an active silicon photomultiplier and associated temperature and non-uniformity compensation circuitry configured to mitigate temperature and process variations on the device. The compensation circuitry may include a reference silicon photomultiplier, a constant current source that supplies a fixed current into the reference silicon photomultiplier, a voltage sensor for detecting a voltage output from the reference silicon photomultiplier, a data converter for converting the voltage output from the voltage sensor, and a voltage controller for generating an adjustable voltage for biasing the active silicon photomultiplier depending on the signal output from the data converter. The active silicon photomultiplier may include multiple illuminated microcells covered by microlenses, whereas the reference silicon photomultiplier may include multiple dark microcells distributed among the illuminated microcells to help account for non-uniformities in microcell performance across the imaging device.

19 Claims, 11 Drawing Sheets

TEMPERATURE AND NON-UNIFORMITY COMPENSATION CIRCUITRY FOR SILICON PHOTOMULTIPLIER

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals. Each pixel may also include a microlens that overlaps and focuses light onto the photosensitive element.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. A parallel array of SPADs (each having a quench resistor in series) is sometimes referred to as a silicon photomultiplier (SiPM). A silicon photomultiplier is typically operated in Geiger mode, which entails application of a reverse-bias voltage that is well above the breakdown voltage of each SPAD. The breakdown voltage is thus a key parameter in the operation of an SiPM. The breakdown voltage, however, may be dependent on silicon manufacturing processing variations and also on the operating temperature. Keeping the reverse-bias voltage constant while the breakdown voltage varies (due to process variations and/or temperature variations) may lead to non-uniformity issues across the SiPM and temperature dependent performance variation.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
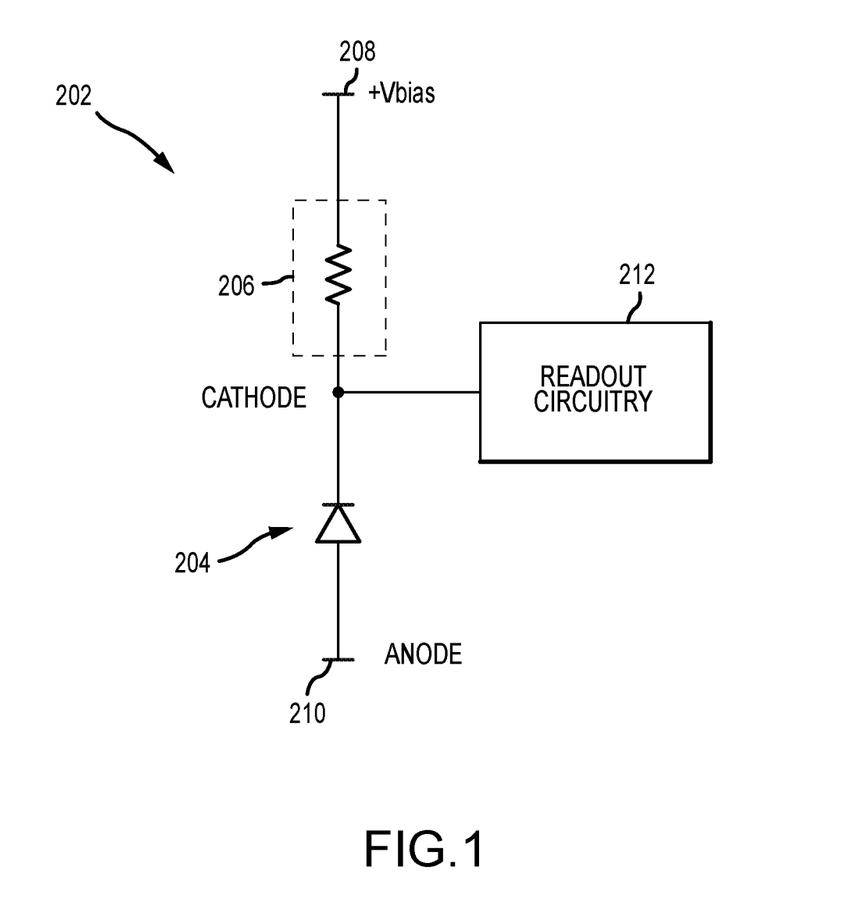
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
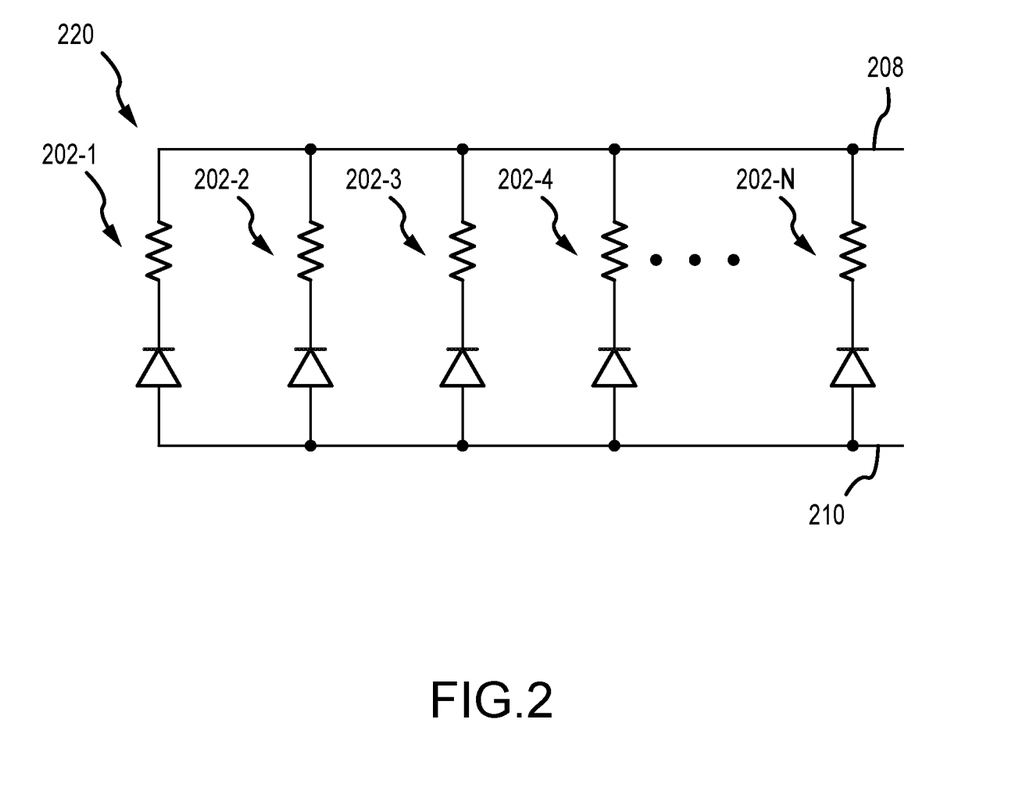
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220. Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
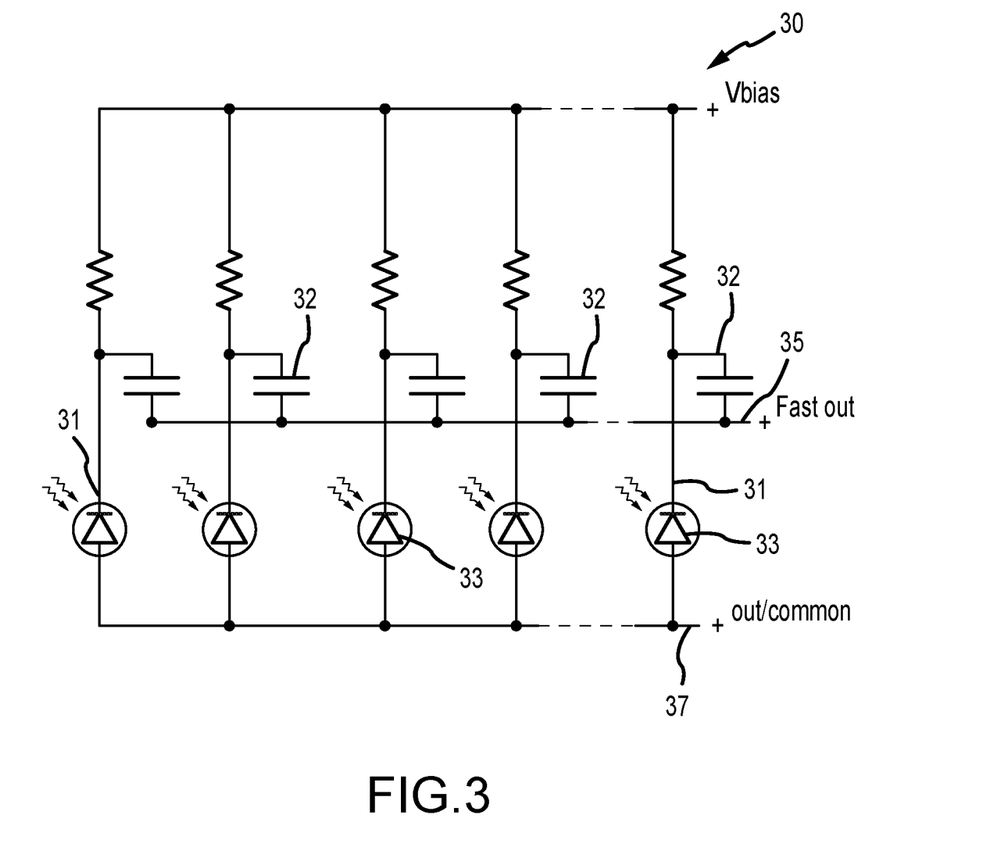
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
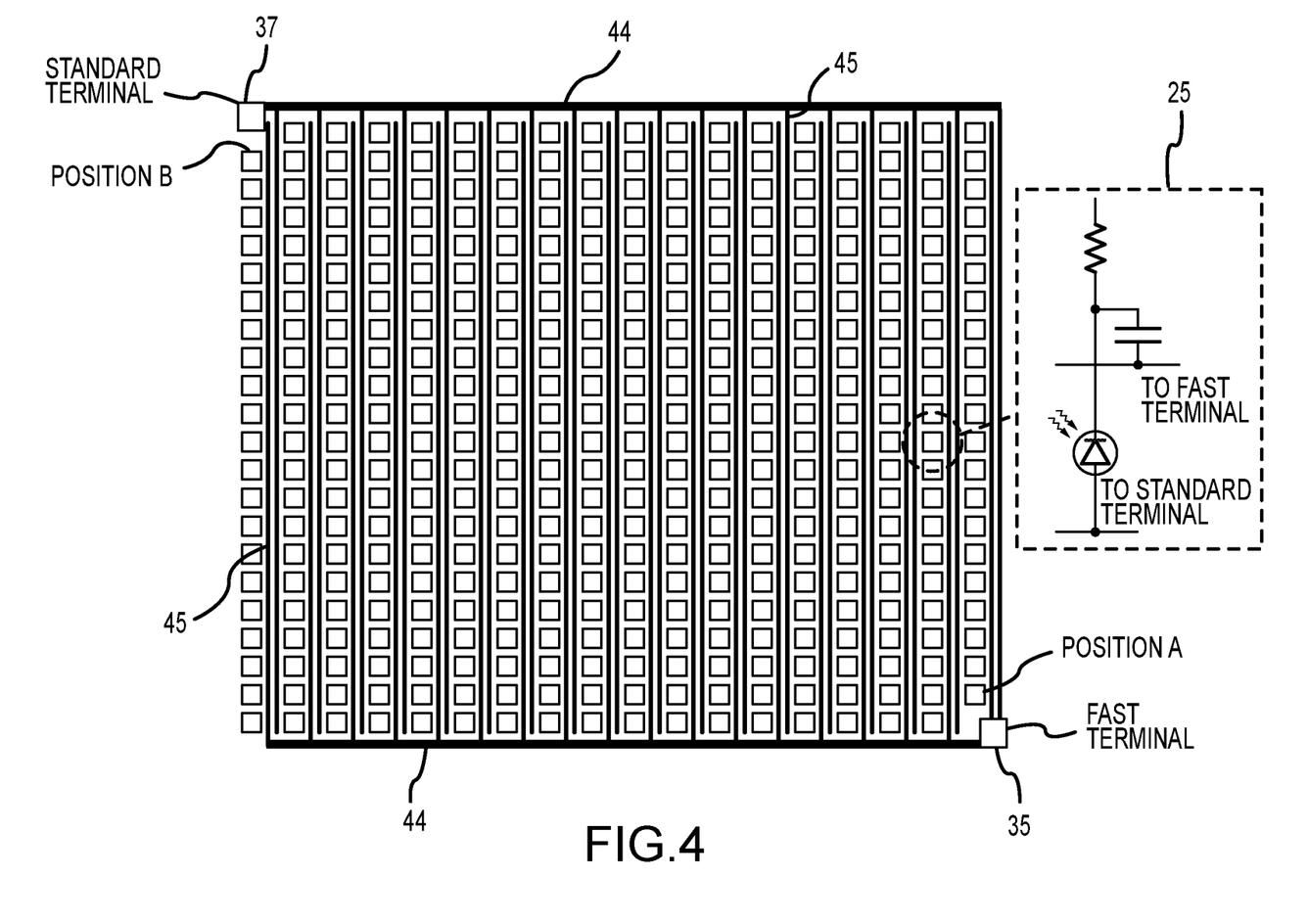
FIG. 4 is a diagram of an illustrative a silicon photomultiplier comprising an array of microcells.

It will be appreciated by those skilled in the art that silicon photomultipliers include major bus lines 44 and minor bus lines 45 as illustrated in FIG. 4. The minor bus liens 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
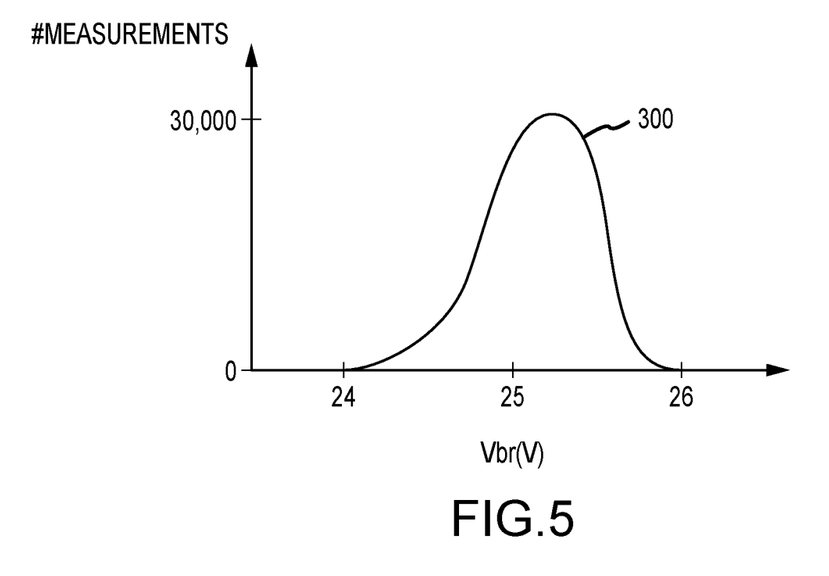
FIG. 5 is a diagram illustrating breakdown voltage variation across a process lot.
Figure 6:
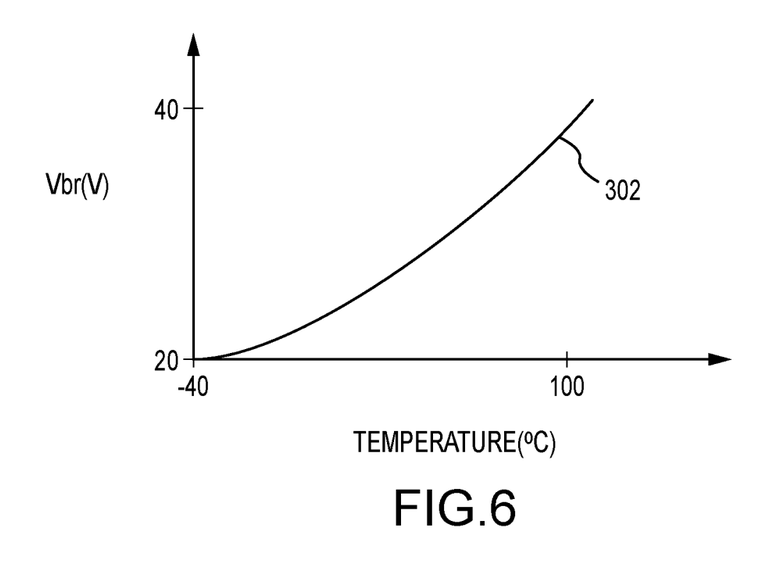
FIG. 6 is a diagram illustrating how breakdown voltage can vary as a function of temperature.

Since SPAD pixels operate in Geiger mode (i.e., reverse biased above their breakdown voltage), the breakdown voltage is a key parameter that affects the performance of the overall silicon photomultiplier. In practice, however, the SPAD breakdown voltage may be dependent on the silicon manufacturing process (due to process variations) and/or the operating temperature. FIG. 5 is a diagram illustrating variation of breakdown voltage Vbr across a process lot. As shown in the frequency distribution curve 300 of FIG. 5, the breakdown voltage Vbr may vary as much as 2V in a single manufacturing process lot. Not only can Vbr vary between SPAD devices formed across a single wafer, but Vbr can also vary as a function of operating temperature (see, e.g., FIG. 6). As shown by curve 302 in FIG. 6, breakdown voltage Vbr is generally higher at greater temperatures.

In general, a silicon photomultiplier is configured to apply a reverse bias voltage to each SPAD device in the array, where the bias voltage is equal to the sum of the breakdown voltage Vbr and an over-bias voltage Vob (i.e., Vbias=Vbr+Vob). In particular, the magnitude of the over-bias voltage Vob should be constant in order to ensure performance uniformity over all possible ranges of Vbr and operating temperatures. Maintaining a constant Vob for an SiPM, however, may be challenging since Vbr may vary due to process and temperature variations.

Figure 7:
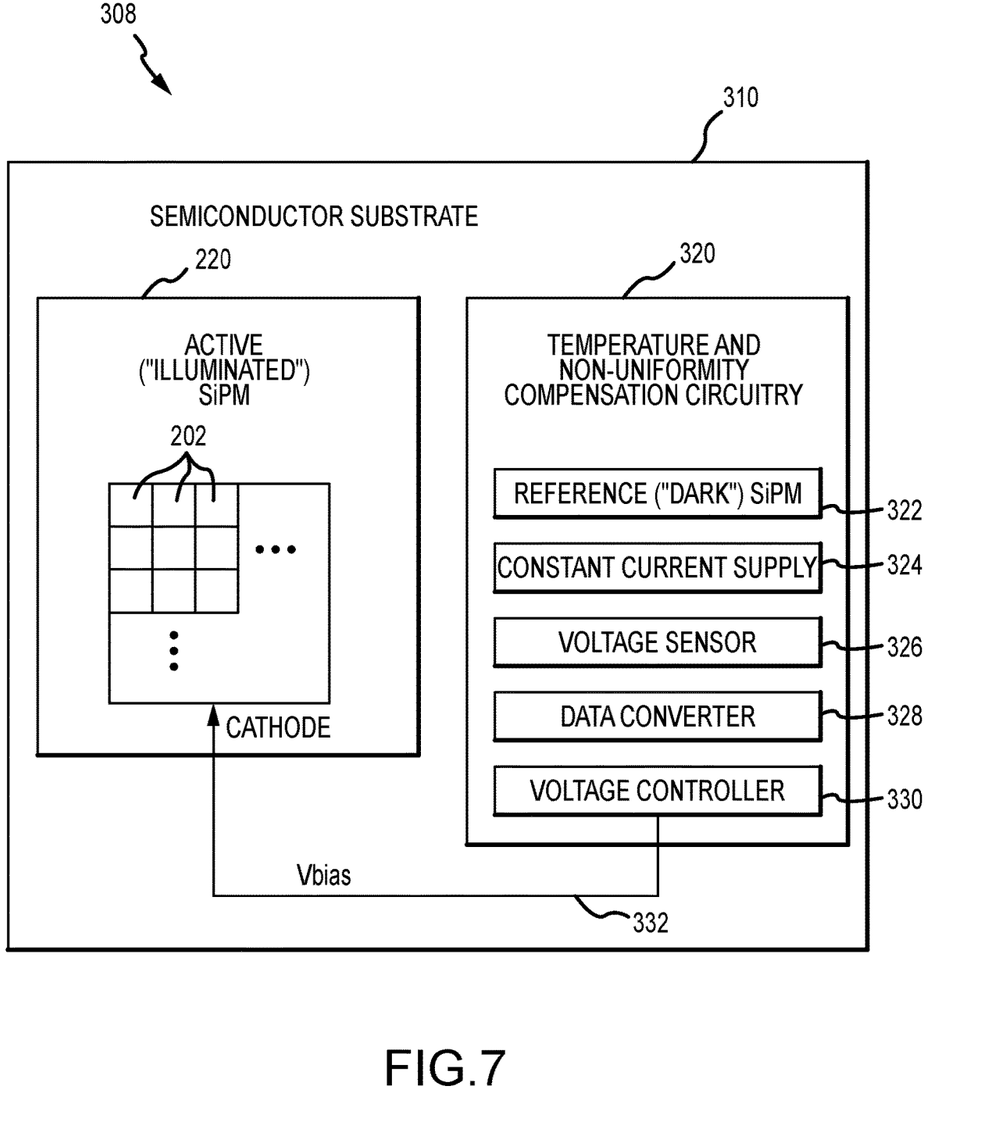
FIG. 7 is a diagram of an illustrative semiconductor device that includes an active silicon photomultiplier and associated temperature and non-uniformity compensation circuitry in accordance with an embodiment.

In accordance with an embodiment, a semiconductor device such as device 308 of FIG. 7 is provided that is capable of offsetting process-induced variations and/or temperature variations in order to keep Vob constant, which ensures performance uniformity across different devices over a wide range of operating temperatures. As shown in FIG. 7, device may include a semiconductor substrate 310 (e.g., a p-type silicon substrate), an active silicon photomultiplier 220 formed on substrate 310, and associated temperature and non-uniformity compensation circuitry 320 also formed on substrate 310. Silicon photomultiplier 220 may include an array of SPAD pixels 202 configured to detect incident photons and are therefore sometimes referred to as "illuminated microcells" 202.

The example of FIG. 7 in which constant current supply 324, voltage sensor 326, data converter 328, and voltage controller 330 are also formed on substrate 310 is merely illustrative. If desired, only active SiPM 220 and reference SiPM 332 need to be formed on the same substrate 310, but the rest of the circuitry (i.e., constant current supply 324, voltage sensor 326, data converter 328, and voltage controller 330) may optionally be formed on another piece of semiconductor substrate.

As described above in connection with FIGS. 5 and 6, illuminated microcells 202 may exhibit a breakdown voltage Vbr that varies from one device to another and varies over different operating temperatures. Compensation circuitry 320 may be configured to mitigate these sources of variation to ensure uniform SPAD performance. As shown in FIG. 7, temperature and non-uniformity compensation circuitry 320 may include a reference photosensitive device such as reference silicon photomultiplier 322, a current source such as constant current supply 324, a voltage detection circuit such as voltage sensor 326, a data converting circuit such as data converter 328, and a voltage controlling circuit such as voltage controller 330. In contrast to the illuminated microcells 202 within the active SiPM 220, the reference SiPM 322 may not receive any incoming photons (if covered by light shielding structures) or may only receive stray light. Thus, reference SiPM 322 may sometimes be described as having one or more "dark microcells." The reference ("dark") SiPM 322 may be used to sense Vbr variations. Any variation that is detected using reference SiPM 322 will in turn direct voltage controller 330 to dynamically adjust bias voltage Vbias, which is fed to the cathode terminals of each SPAD device 202 via path 332 to compensate for changes in Vbr across different operating temperatures.

Figure 8:
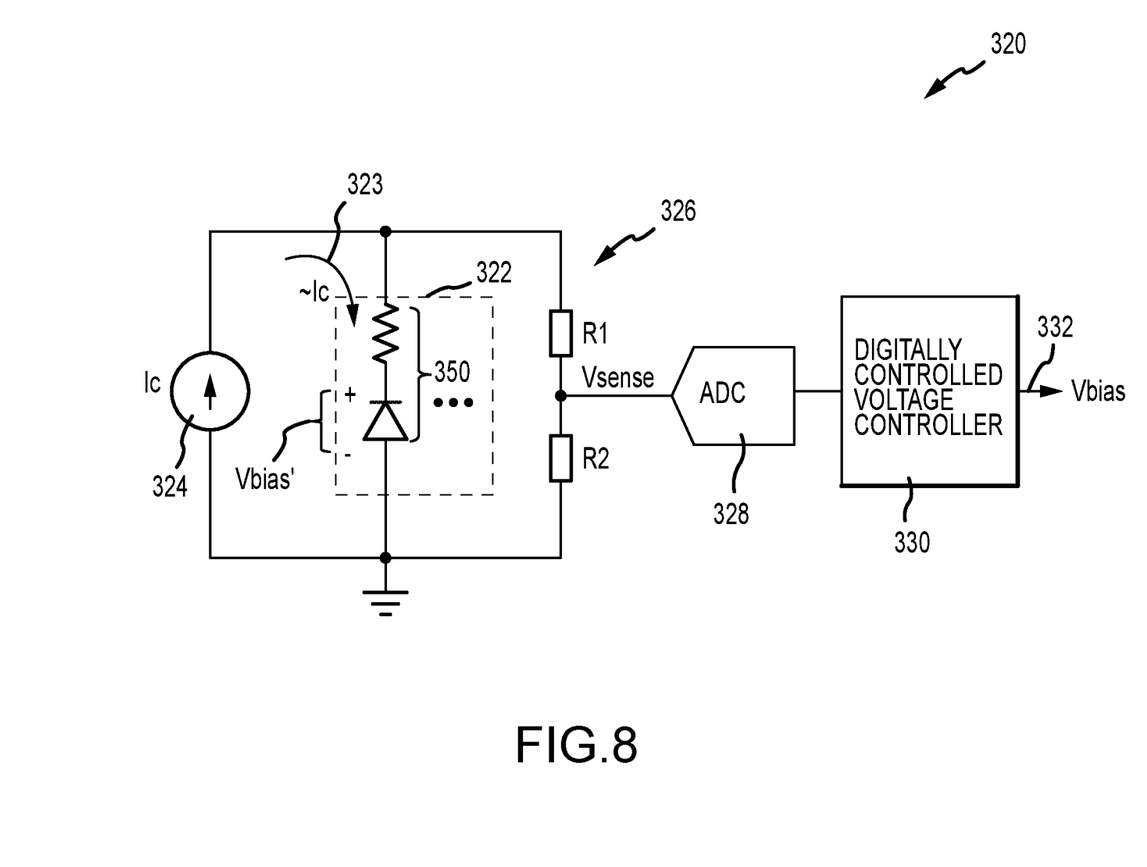
FIG. 8 is a diagram of illustrative temperature and non-uniformity compensation circuitry for a silicon photomultiplier in accordance with an embodiment.

FIG. 8 is a diagram of illustrative temperature and non-uniformity compensation circuitry 320. As shown in FIG. 8, compensation circuitry 320 includes a constant current source 324 configured to supply a constant current Ic, a reference SiPM 322 configured to receive the fixed current Ic from constant current supply 324, and a voltage sensor 326 coupled in parallel with reference SiPM 322. Reference SiPM may include one or more dark microcells 350, each of which includes a SPAD connected in series with a quenching resistor (as an example). Since reference dark SiPM 322 is formed on the same semiconductor substrate as the active illuminated SiPM 220 (see FIG. 7), the reference SiPM 322 is able to accurately track any process variation exhibited by the active SiPM 220 without the need to perform any additional calibration.

Voltage sensor 326 may, for example, be implemented using a voltage divider circuit having resistors R1 and R2 connected in series. This is, however, merely illustrative. In general, any suitable type of voltage sensor may be used. The resistances of resistors R1 and R2 may be relatively large compared to the resistance of reference SiPM 322. In one suitable arrangement, R1 and R2 may be 9.5 mega-ohms and 0.5 mega-ohms, respectively, totaling 10 MΩ in combined resistance. Configured in this way, most of the current Ic generated by fixed current source 324 will flow into the reference SiPM 322 (e.g., at least 90% of Ic will flow into the dark microcell(s), at least 95% of Ic will flow into the dark microcell(s), at least 99% of Ic will flow into the dark microcell(s), at least 99.9% of Ic will flow into the dark microcell(s), 90-100% of Ic will flow into the dark microcell(s), etc.). In general, voltage sensor 326 may be provided with any suitable impedance value such that more than 90% of the constant current Ic is diverted into the reference SiPM 322, as shown by arrow 323. To achieve this, voltage sensor 326 should exhibit a resistance that is at least ten times greater than the resistance of the reference silicon photomultiplier, at least 100 times greater than the resistance of the reference silicon photomultiplier, at least 1000 times greater than the resistance of the reference silicon photomultiplier, 10-1000 times greater than the resistance of the reference silicon photomultiplier, etc.

Voltage divider 326 may have an output on which a sensor output voltage Vsense is provided. Voltage signal Vsense may be fed to data converter 328 (e.g., an analog-to-digital converter), which is configured to convert analog voltage Vsense into its digital equivalent. The converted digital signal at the output of converter 328 is then used to control a digitally controlled voltage controller 330, which dynamically adjusts bias voltage Vbias for reverse biasing each of the SPADs in the active SiPM.

Applying a constant current Ic to the reference SiPM effectively configures the dark microcell(s) 350 as a temperature dependent voltage source. In particular, the over-bias voltage Vob across the dark microcell(s) 350 will also be a function of the characteristic breakdown voltage Vbr of the active SiPM and its operating temperature. Setting the current flowing through the reference SiPM at a constant value enables a reproducible dependence on both temperature and Vbr, which in turn allows compensation circuitry 320 to generate a temperature and Vbr dependent voltage Vsense at the output of voltage sensor 326. This voltage Vsense is then converted by data converter 328, the result of which will be used by voltage controller 330 to select a bias voltage Vbias for the active SiPM that is a fixed value above breakdown voltage Vbr regardless of the actual value of Vbr and the ambient temperature.

The diagram of FIG. 7 in which the active SiPM 220 and the reference SiPM 322 are shown as physically separated structures on semiconductor substrate 310 is merely illustrate and is not intended to limit the scope of the present embodiments. In practice, the amount of dark current experienced by different SPADs across the surface of a given SiPM may be non-uniform. In some instances, a small number of microcells may exhibit excessively large dark counts and may therefore sometimes be referred to as "screamers." In such screamer scenarios, implementing a single reference microcell at the edge of the active SiPM to compensate for temperature and process variations can result in poor correlation with the actual dark current of the overall SiPM.

Figure 9:
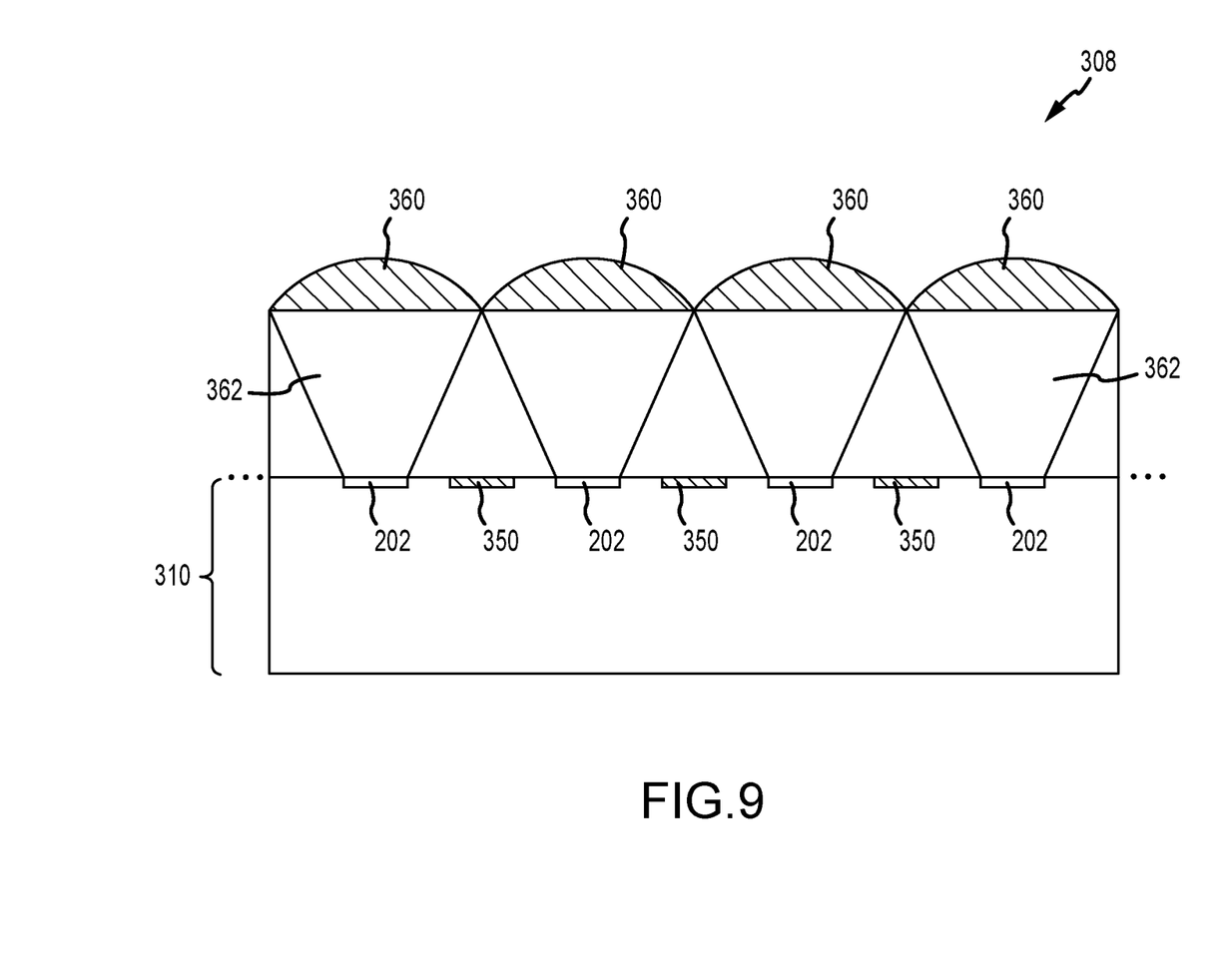
FIG. 9 is a cross-sectional side view of a semiconductor device of the type shown in FIG. 7 where dark microcells are distributed among the illuminated microcells in accordance with an embodiment.

To solve this problem, semiconductor device 308 may have dark microcells 350 (which are part of the reference SiPM) that are distributed evenly among the illuminated microcells 202 (which are part of the active SiPM), as shown in FIG. 9. A microlens 360 may be formed over each illuminated microcell 202. Light guide structures 362 may be formed between microlenses 360 and substrate 310 and may be configured to direct incoming photons from each microlens 360 to the corresponding illuminated microcell 202 below. Forming microlenses 360 in which way enables greater spacing of the microcells than would normally be possible and also allows for minimization of microcell size, which can help optimize dark count rate, reduce pixel crosstalk, and improve dynamic range.

A dark microcell 350 may be interposed in the substrate 310 between two adjacent illuminated microcells 202 and may therefore sit below the point at which neighboring microlenses 360 meet. Light focused by the microlenses 362 should not fall on the dark microcells 350. Dark microcells 350 need not be covered as they should not be illuminated by any photons focused by the micro-lenses. Dark microcells 350, however, may be activated when a stray photon is incident on the SiPM surface. This is a useful feature as it allows compensation for changes in ambient light photons. Forming SiPMs in this way where each illuminated microcell 202 has a neighboring unilluminated microcell 350 enables device 308 to account for non-uniformities that might be present across the surface of device 308 (e.g., the distributed/interleaving microcell arrangement of FIG. 9 can help average out any non-uniform dark noise or screamer issues). If desired, dark microcells 350 may optionally be covered by associated light blocking or shielding structures.

Figure 10:
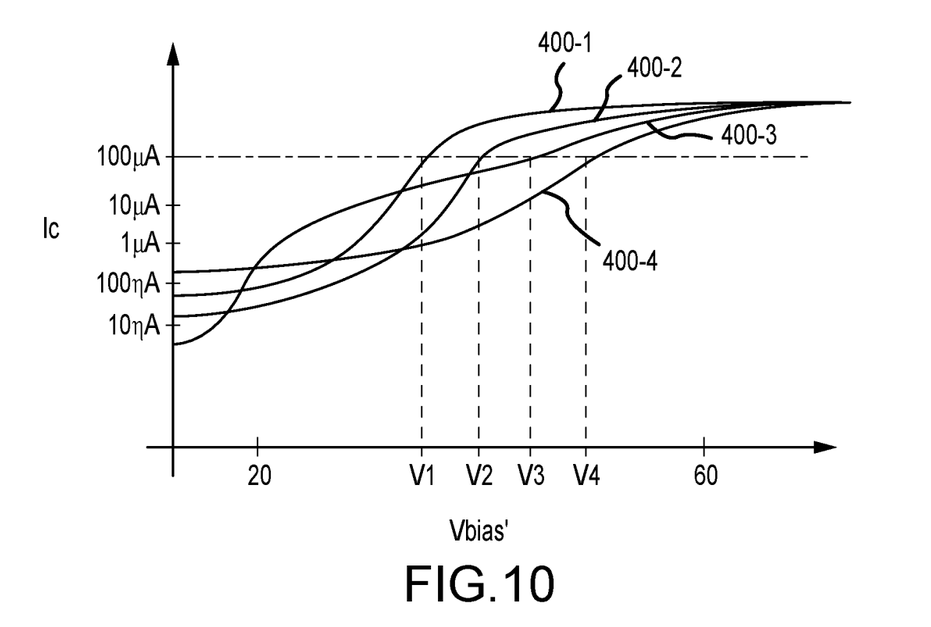
FIG. 10 is a diagram showing how providing a fixed current into a reference microcell can yield different bias voltages at different temperatures in accordance with an embodiment.

FIG. 10 is a diagram showing how providing a fixed current into a reference (dark) microcell can yield different bias voltages at different operating temperatures. FIG. 10 plots current (on a logarithmic scale) as a function of Vbias', which represents the reverse bias voltage across the cathode and anode terminals of a SPAD in the reference SiPM (see FIG. 8). Curve 400-1 represents the current profile as a function of Vbias' at a first temperature; curve 400-2 represents the current profile as a function of Vbias' at a second temperature that is greater than the first temperature; curve 400-3 represents the current profile as a function of Vbias' at a third temperature that is greater than the second temperature; and curve 400-4 represents the current profile as a function of Vbias' at a fourth temperature that is greater than the third temperature.

If the current through the reference SPAD is fixed at 100 µA (as shown by the dotted horizontal line), then Vbias' may vary depending on the operating temperature. Thus, assuming Ic=100 µA, Vbias' will be equal to V1 at the first temperature, to V2 at the second temperature, to V3 at the third temperature, and to V4 a the fourth temperature, where V1<V2<V3<V4. In other words, the dark microcell acts like a temperature dependent voltage source.

Figure 11:
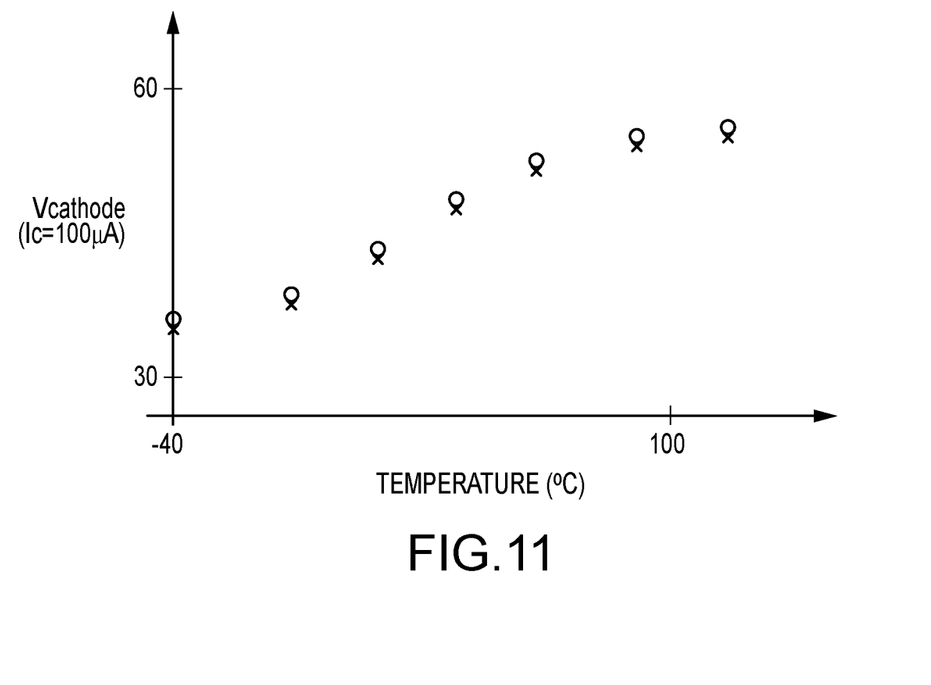
FIG. 11 is a diagram showing how the cathode voltage of a reference microcell is similar to the cathode voltage of an active microcell at different temperatures when diode current is fixed in accordance with an embodiment.

FIG. 11 is a diagram showing how the cathode voltage of a reference microcell is similar to the cathode voltage of an active microcell at different temperatures when Ic is fixed at 100 µA. The data points marked using "x" represents Vcathode measurements for the reference SiPM at different temperatures, whereas the data points marked using "o" represents Vcathode measurements for the active SiPM across different temperatures. As shown by FIG. 11, the performance of the reference SiPM track very well with the performance of the active SiPM over a wide range of temperatures (e.g., the x's substantially coincide with the o's).

Figure 12:
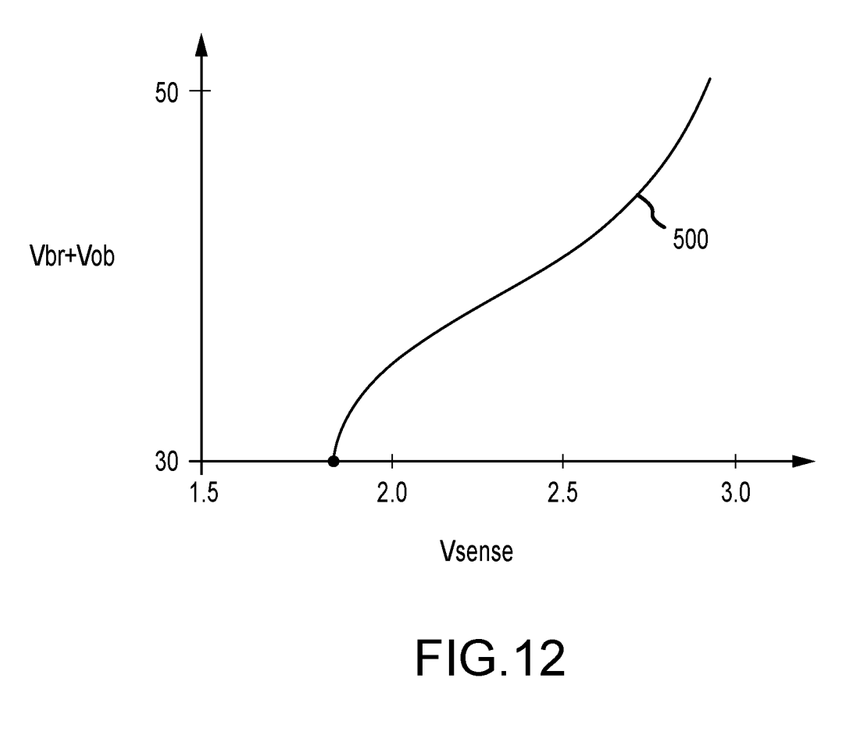
FIG. 12 is a diagram of an illustrative curve that can be used to program the way in which the temperature and non-uniformity compensation circuitry controls the active silicon photomultiplier in accordance with an embodiment.

FIG. 12 is a diagram of an illustrative curve 500 that can be used to program the way in which temperature and non-uniformity compensation circuitry 320 of the type described in connection with FIGS. 7 and 8 controls the active SiPM. The x-axis represents voltage Vsense generated at the output of the voltage sensor/detector, whereas the y-axis represents the sum of Vbias and Vob, the total of which should be applied as Vbias to the active SiPM. As described above, Vbr may be subject to change due to process and temperature variations, but Vob should have a constant value of 10 V (as an example). Curve 500 may dictate how data converter 328 and digitally controlled voltage controller 330 outputs Vbias. In particular, curve 500 (which may be linear or non-linear) may be encoded as a pre-calibrated lookup table that configures how Vbias should be adjusted depending on the digital signal it receives from data converter 328.

Figure 13:
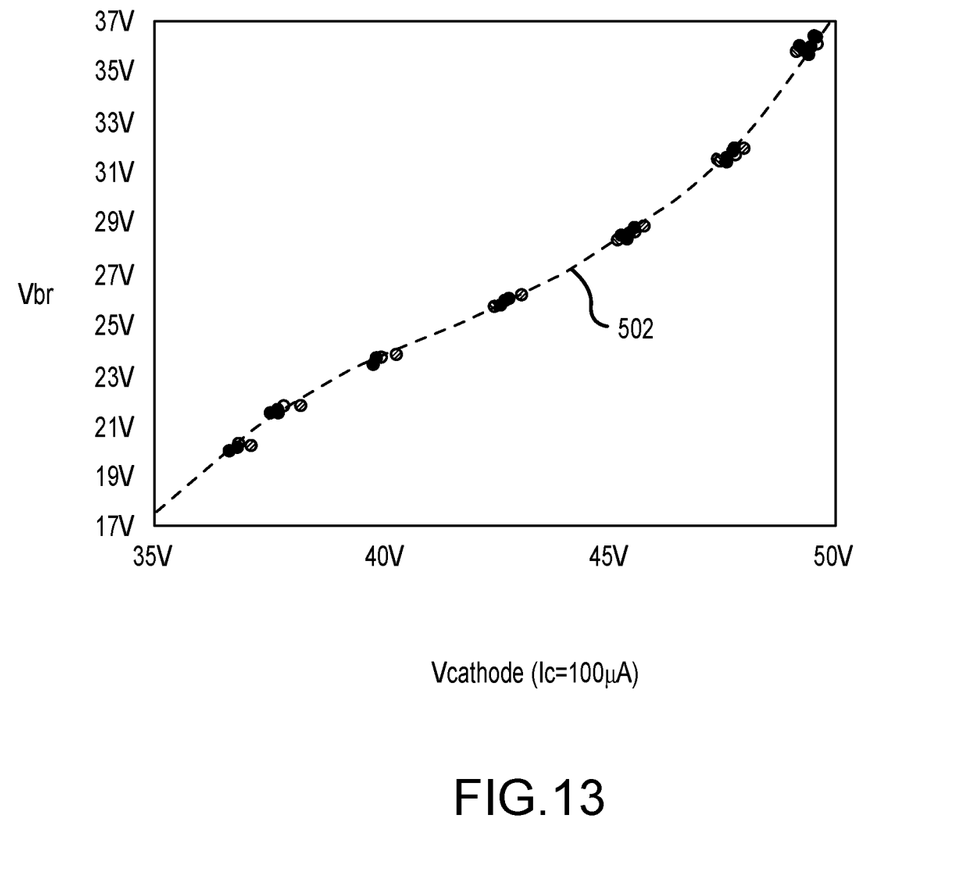
FIG. 13 is a diagram illustrating how cathode voltage for different devices all lie along the same curve regardless of breakdown voltage value in accordance with an embodiment.

FIG. 13 is a diagram illustrating how cathode voltage for different devices all lie along the same curve regardless of the value of Vbr. In particular, FIG. 13 plots breakdown voltage Vbr as a function of the cathode terminal voltage, assuming Ic is again fixed at 100 µA. As shown in FIG. 13, the various data points along curve 502 represent measurements obtained from different semiconductor devices 308. All of the data points lie along the same curve 502 regardless of the value of Vbr. This illustrates how uniformity across different devices may be achieved using the compensation circuitry 320 described herein.

The foregoing is merely illustrative of the principles of this invention and various modifications can be made by those skilled in the art. The foregoing embodiments may be implemented individually or in any combination.

What is claimed is:

1. A semiconductor device, comprising:
   a substrate;
   an active silicon photomultiplier having a plurality of illuminated microcells formed in the substrate, wherein the plurality of illuminated microcells exhibit a breakdown voltage;
   a reference silicon photomultiplier having a plurality of reference microcells formed in the substrate, wherein the reference silicon photomultiplier is used to compensate for process and temperature variations in the breakdown voltage; and
   a current source configured to supply a constant current to the reference silicon photomultiplier.

2. The semiconductor device of claim 1, wherein the plurality of reference microcells are distributed among the plurality of illuminated microcells.

3. The semiconductor device of claim 1, wherein each reference microcell in the plurality of reference microcells is physically interposed between at least two adjacent illuminated microcells in the plurality of illuminated microcells.

4. The semiconductor device of claim 1, further comprising a plurality of microlenses each of which is aligned to a corresponding one of the plurality of illuminated microcells.

5. The semiconductor device of claim 1, wherein the plurality of reference microcells are configured to receive only stray photons.

6. The semiconductor device of claim 1, further comprising a voltage sensor coupled in parallel with the reference silicon photomultiplier.

7. The semiconductor device of claim 6, wherein the voltage sensor comprises a voltage divider circuit.

8. The semiconductor device of claim 6, wherein the voltage sensor exhibits a resistance that is at least ten times greater than the resistance of the reference silicon photomultiplier.

9. The semiconductor device of claim 6, further comprising a data converter configured to receive a voltage output from the voltage sensor.

10. The semiconductor device of claim 9, wherein the data converter comprises an analog-to-digital data converter circuit.

11. The semiconductor device of claim 9, further comprising a voltage controller configured to receive signals form the data converter and to generate a bias voltage that is applied to the active silicon photomultiplier.

12. A method of operating a semiconductor device having a substrate, the method comprising:
   with a plurality of active microcells formed in the substrate, receiving incident photons;
   with a plurality of dark microcells formed in the substrate, outputting a bias voltage that is dependent on operating temperature;
   using a voltage detector to sense the bias voltage output from the plurality of dark microcells;
   using an analog-to-digital data converter to receive a voltage signal from the voltage detector and to output a corresponding digital signal; and
   using the digital signal output from the analog-to-digital data converter to account for non-uniformities in dark current noise across the surface of the substrate and to compensate for process variations.

13. The method of claim 12, wherein the plurality of active microcells and the plurality of dark microcells are implemented using single-photon avalanche diodes.

14. The method of claim 13, further comprising using the plurality of dark microcells as a temperature dependent voltage source.

15. The method of claim 13, further comprising supplying a constant current into the plurality of dark microcells.

16. The method of claim 15, further comprising:
   and
   with a voltage controller, receiving the digital signal and providing a dynamically adjustable voltage to the plurality of active microcells, wherein the dynamically adjustable voltage is adjusted as a function of the voltage sensed by the voltage detector.

17. An imaging device, comprising:
   an active silicon photomultiplier; and
   a reference silicon photomultiplier; and
   a voltage sensor coupled in parallel with the reference silicon photomultiplier, wherein the reference silicon photomultiplier and the voltage sensor are used to obtain a compensation value.

18. The imaging device of claim 17, wherein the active silicon photomultiplier comprises a first plurality of single-photon avalanche diodes, and wherein the reference silicon photomultiplier comprises a second plurality of single-photon avalanche diodes interspersed among the first plurality of single-photon avalanche diodes.

19. The imaging device of claim 18, wherein the reference silicon photomultiplier is configured as a temperature dependent voltage source.

* * * * *